(12) United States Patent
Loopstra et al.

(10) Patent No.: US 7,619,207 B2
(45) Date of Patent: Nov. 17, 2009

(54) LITHOGRAPHIC APPARATUS AND DEVICE MANUFACTURING METHOD

(75) Inventors: Erik Roelof Loopstra, Heeze (NL); Emiel Jozef Melanie Eussen, Eindhoven (NL); Engelbertus Antonius Fransiscus Van Der Pasch, Oirschot (NL); Onno Bram Loopstra, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 427 days.

(21) Appl. No.: 11/594,230

(22) Filed: Nov. 8, 2006

(65) Prior Publication Data

US 2008/0105026 A1    May 8, 2008

(51) Int. Cl.
*G21G 5/00* (2006.01)
*H03M 1/48* (2006.01)

(52) U.S. Cl. .................. 250/231.11; 250/231.13; 250/231.14; 250/491.1; 356/615

(58) Field of Classification Search ......... 356/614–617; 250/491.1, 231.11, 231.13, 231.14, 231.19, 250/237 G
See application file for complete search history.

(56) References Cited

U.S. PATENT DOCUMENTS

| | | | |
|---|---|---|---|
| 4,709,146 A * | 11/1987 | Reitsema ............... | 250/231.14 |
| 7,002,137 B2 * | 2/2006 | Thorburn et al. ....... | 250/231.13 |
| 7,067,797 B1 * | 6/2006 | Mitchell et al. ........ | 250/231.13 |
| 7,126,109 B2 * | 10/2006 | Goldman et al. ....... | 250/231.14 |
| 7,321,113 B2 * | 1/2008 | Hare et al. ............. | 250/231.13 |
| 7,348,574 B2 * | 3/2008 | Pril et al. ................ | 250/491.1 |
| 7,362,446 B2 * | 4/2008 | Van Der Pasch et al. .... | 356/499 |

* cited by examiner

*Primary Examiner*—Sang Nguyen
(74) *Attorney, Agent, or Firm*—Pillsbury Winthrop Shaw Pittman LLP

(57) ABSTRACT

The present invention relates to a method for calibrating a grating of an encoder measurement system between two adjacent calibrated locations, the method includes moving one of a sensor object including an encoder-type sensor and a grating along the other one of the sensor object and the grating with a speed, wherein the speed is selected such that disturbances in the grating substantially extending over a distance smaller than a distance between the two calibrated locations can not or only partly be followed by the one of the sensor object and the grating, and measuring during the moving the position of the sensor object with respect to the grating at a plurality of locations between the two calibrated locations.

19 Claims, 2 Drawing Sheets

LITHOGRAPHIC APPARATUS AND DEVICE MANUFACTURING METHOD

BACKGROUND

1. Field

The present invention relates to a method for calibration of a grid plate. Furthermore, the invention relates to a lithographic apparatus configured for the calibration method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus high accuracy position measurement systems are used to determine the position of movable objects such as wafer stage and reticle stage. Two known systems which are used are interferometer systems and encoder-type measurement systems. In the encoder type measurement systems use is made of one or more one-dimensional gratings which may be combined in multi-dimensional grids. These gratings or grids may be arranged on a one-dimensional or multi-dimensional grid plate. The grid plate may be mounted on a substantially stationary part of the lithographic apparatus. One or more encoder-type sensors capable of measuring the position of the sensor with respect to the grid plate in one or more degrees of freedom are mounted on the movable object. In alternative embodiments the grid plate may be mounted on the movable object and the sensor may be mounted on a substantially stationary location.

For certain applications, in particular for use in a lithographic apparatus, the fabrication accuracy of the grating is not sufficient to obtain the desired accuracy needed for these applications. For instance, the fabrication accuracy of a grating may be on a micron level, while a stage position measurement system requires a sub-nanometer accuracy.

To take these manufacturing errors into account a so-called metrology map may be used in which the errors of the grating are incorporated. These errors are obtained during calibration of the grating and consequently incorporated into the metrology map. During actual use of the measurement system the values of the metrology map are used to correct for the errors in grating.

A known calibration method for determining the errors and making a metrology map is the so-called fishbone-like technique. In this technique, multiple measurements are made in an area of a calibration location and the results of the measurements are averaged to obtain the calibration value of the calibration location. To obtain a desired accuracy for a certain calibration location a minimum area in which the multiple measurements are made, is required. For instance, when an accuracy of 0.1 nm has to be obtained a grid spacing, i.e. the distance between adjacent calibration locations, of about 2-5 mm is required. However, with increasing requirements on the accuracy of the measurements, the calibration grid spacing may not be sufficient to obtain the desired accuracy during actual position measurement. For instance to obtain a 0.1 nm accuracy during actual position measurement, the same grating of the above example has to be calibrated with a grid spacing of about 0.4 mm. Thus, a drawback of the state of the art calibration methods is that the calibration grid spacing becomes too large when the required accuracy of a encoder measurement system is increased.

SUMMARY

It is desirable to provide a calibration method with which the density of calibration locations can be increased without losing calibration accuracy.

According to an embodiment of the invention, there is provided a method for calibrating a grating of an encoder measurement system between two adjacent calibrated locations, the method including moving one of a sensor object including an encoder-type sensor and a grating along the other of the sensor object and the grating with a speed, wherein the speed is selected such that disturbances in the grating substantially extending over a distance smaller than a distance between the two calibrated locations can not or only partly be followed by the one of the sensor object and the grating, and measuring during the moving the position of the sensor object with respect to the grating at a number of locations between the two calibrated locations.

In another embodiment of the invention, there is provided a method of calibrating a grating of an encoder measurement system between two adjacent calibrated locations, the method including moving one of a sensor or a grating along the other one of the sensor or the grating at a selected speed, the speed selected such that 1) the one of the sensor or the grating is moved to maintain a substantially same distance between the sensor and the grating when the sensor passes over a disturbance in the grating that extends over a distance at least larger than a distance between the two calibrated locations, and 2) the one of the sensor or the grating remains substantially unmoved when the sensor passes over a disturbance in the grating that extends over a distance smaller than the distance between the two calibrated locations; and measuring during the moving a position of the sensor with respect to the grating at a plurality of locations between the two calibrated locations.

In an embodiment of the invention, there is provided a A position measurements system including a sensor and a grating; and a control unit configured to move one of the sensor or the grating relative to the other one of the sensor or the grating at a selected speed, the speed selected such that 1) the one of the sensor or the grating is moved to maintain a substantially same distance between the sensor and the grating when the sensor passes over a disturbance in the grating that extends over a distance at least larger than a distance between two calibrated locations, and 2) the one of the sensor of the grating remains substantially unmoved when the sensor passes over a disturbance in the grating that extends over a distance smaller than the distance between the two calibrated locations.

In yet another embodiment of the invention, there is provided a lithographic apparatus including an illumination system configured to condition a beam of radiation; a pattern support configured to support a patterning device, the patterning device configured to pattern the beam of radiation to form a patterned beam of radiation; a substrate support configured to support a substrate; a projection system configured to project the patterned beam of radiation onto the substrate; and a position measurement system configured to measure a position of one of the supports, the position measurement system including a sensor and a grating; and a control unit configured to move one of the sensor or the grating relative to the other one of the sensor or the grating at a selected speed, the speed selected such that 1) the one of the sensor or the grating is moved to maintain a substantially same distance between the sensor and the grating when the sensor passes over a disturbance in the grating that extends over a distance at least larger than a distance between two calibrated locations, and 2) the one of the sensor of the grating remains substantially unmoved when the sensor passes over a disturbance in the grating that extends over a distance smaller than the distance between the two calibrated locations.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
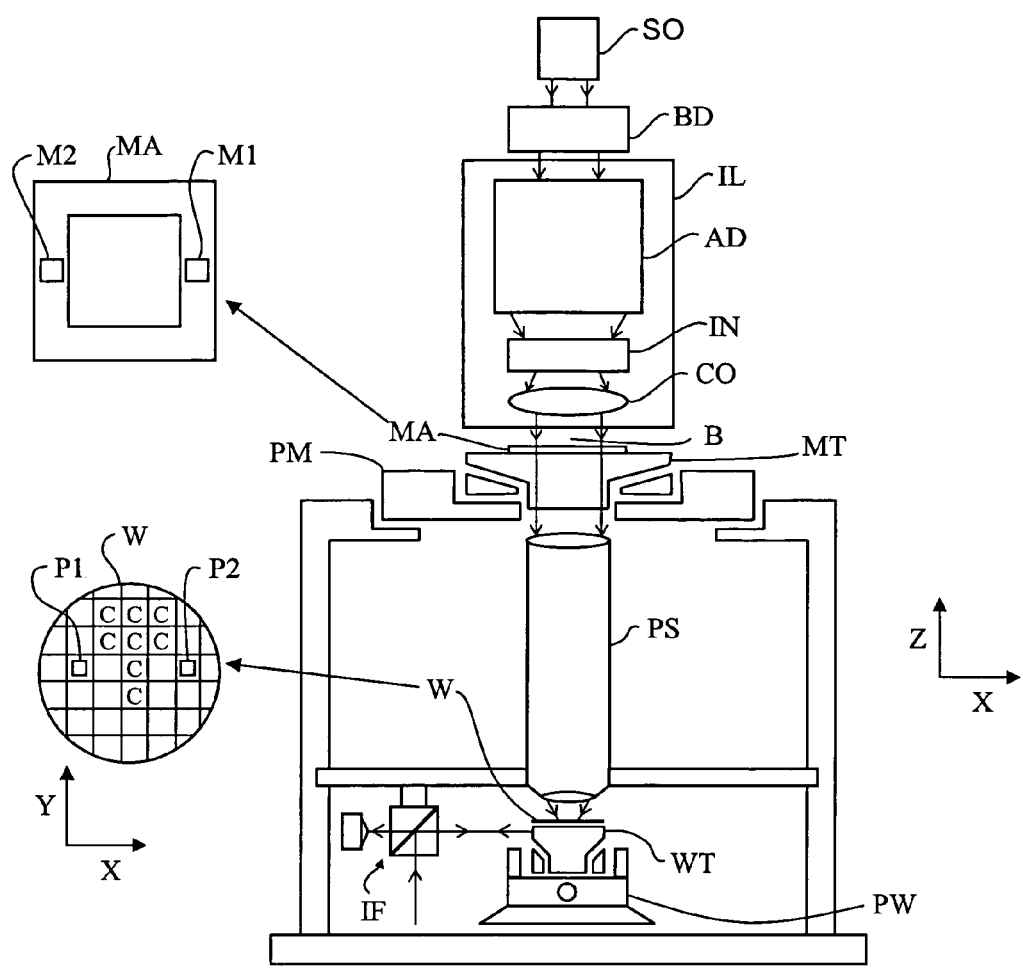
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
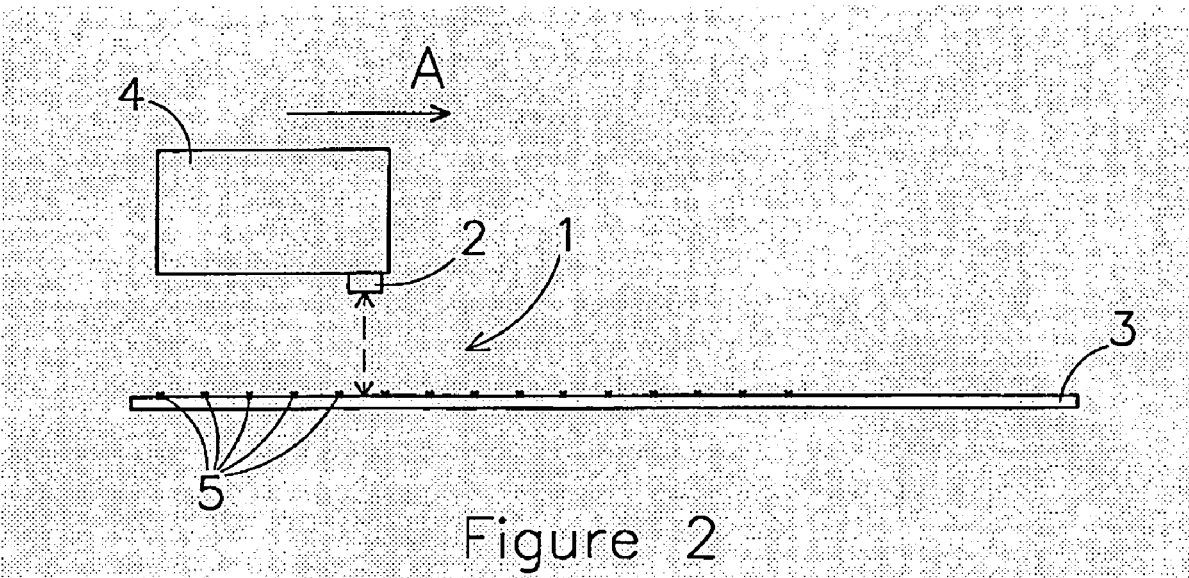
FIG. 2 depicts a stage including a sensor and a grid plate in accordance with an embodiment of the invention.

FIG. 2 shows schematically an encoder-type position measurement system 1 including an encoder-type sensor 2 and a grid plate 3. The grid plate 3 is a plate on which one or more one-dimensional gratings are provided. The sensor 2 is mounted on a sensor object 4, such as, for example, a wafer or substrate stage or a reticle or patterning device stage. The position measurement system 1 is configured to measure the position of the sensor object with respect to the grid plate in at least one degree of freedom.

The grating of the grid plate 3 can only be manufactured with a certain accuracy. The manufacturing accuracy of state of the art grid plates may not be sufficient to obtain the desired measuring accuracy. In order to increase the accuracy obtained during position measurement, the grid plate 3 is calibrated. Such calibration may be carried out by a so-called fishbone technique in which in an area around each calibration location 5 a number of calibration measurements are made to measure any disturbances such as fabrication errors in the grid plate. In such fish-bone technique two spaced marks are imaged, and consequently the marks are again imaged at a staggered position wherein the first image of the first mark and the second image of the second mark in principal should correspond. By comparing the imaged marks, the deviation in the position of the stage may be determined.

The calibration data may be incorporated in a correction map, a so-called metrology map which is used during actual measurement to take disturbances into account.

However, the density of calibration locations may be limited as a certain area is desired around a calibration location to obtain a certain calibration accuracy. For instance, when an accuracy of 0.1 nm has to be obtained, a grid spacing, i.e. the distance between adjacent calibration locations, of about 2-5 mm is desired. Furthermore, with increasing requirements on the accuracy of the measurements, this calibration grid spacing may not be sufficient to obtain the desired accuracy during actual position measurement. For instance to obtain a 0.1 nm accuracy during actual position measurement, the same grid plate 3 has to be calibrated with a grid spacing of about 0.4 mm.

In an embodiment of the present invention, a calibration method is proposed with which the density of calibration locations may be further increased. According to this method, measurements are made with the encoder-type sensor 2 at a number of locations between two calibrated locations 5, whereby the sensor object 4 is moved in the indicated direction (arrow A) with a certain speed over the grid plate. The speed is selected such that disturbances in the grid plate 3 substantially extending over a distance smaller than a distance between the two calibrated locations 5 can not or only partly be followed by the sensor object 4. As a result calibration data may be obtained as will be explained hereinafter.

Figure 3:
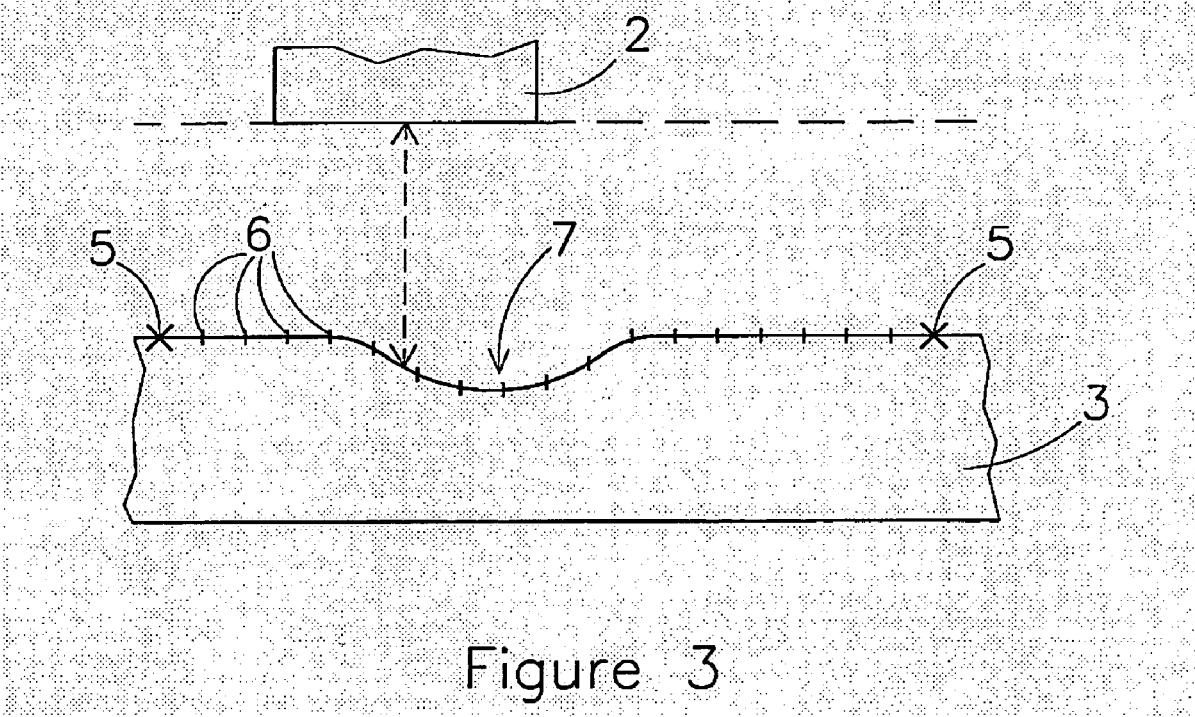
FIG. 3 depicts a part of the grid plate of FIG. 2.

In FIG. 3, a part of the grid plate 3 of FIG. 2 is shown including two calibrated locations 5. The calibrated locations 5 are obtained by a calibration method having a relatively low spatial frequency, i.e. a relatively large calibration grid spacing. As explained above, it may be desirable to increase the number of calibration locations. When the sensor object 4 is controlled to move at a certain height above the grid plate 3 (for example with a control unit), the sensor may measure at a number of locations 6 between the two calibrated locations, the position of the sensor 2 with respect to the grid plate 3. The speed of the sensor object is selected (for example by the control unit) such that the sensor object is substantially not capable of following disturbances in the grid plate substantially extending over a distance smaller than a distance between the two calibrated locations 5. This incapacity to follow disturbances having a relatively small spatial frequency is mainly caused by the inertia of the combination of a sensor object and sensor. Therefore, a reticle or patterning stage or wafer or substrate stage, which is relatively heavy, is very suitable as sensor object.

When a disturbance 7 exists at one or more of the calibration locations 6, the sensor 2 will measure a position which does not correspond with the controlled height at which the sensor object travels along the grid plate 3, since the servo-controller of the sensor object will not be capable of adapting the height of the sensor object to follow the disturbance. The difference between the measured position and the controlled height gives for instance the depth of the disturbance. In this way calibration data is obtained for all calibration locations 6 therewith increasing the density of calibration locations. Disturbance data measured by the position measurement system at a plurality of locations between two calibrated locations may be stored in a storage unit.

In contrast, if the disturbance would extend over a number of calibration locations 5 the servo-controller of the sensor object would adapt the height of the sensor object so that the measured position and the controlled height would be the same.

As it is assumed in this method that the height of the sensor object 4 above the grid plate is constant, but not influenced by the presence of high spatial frequency disturbances of the grid plate 3, it is desirable that the speed of the sensor object 4 is chosen such that the sensor object and the sensor are substantially not capable of following disturbances smaller than the distance between two adjacent calibration locations 5. In an embodiment the speed of the sensor object is selected to be minimally the bandwidth of a servo controller of the sensor object multiplied by the distance between the two calibrated locations. When the speed is determined in this way, the sensor object will substantially not be able to follow the disturbances in the grid plate.

In general the speed of the sensor object may be chosen as high as possible, while still allowing the sensor 2 to measure the position at the desired calibration locations 6.

In practice the bandwidth of the servo control loop of a stage may for instance be 200 Hz. Assuming a distance between calibrated locations 5 of 5 mm, the sensor object 4 will not be able to follow any disturbances smaller than 5 mm when the speed of the sensor object is 1 m/s. When the sample frequency of the sensor is 20 kHz the sensor may obtain a measurement each 0.05 mm.

The bandwidth of the servo control loop of the sensor object may be adjustable. In such embodiment the bandwidth may be lowered to decrease the ability of the sensor object to follow disturbances in the grid plate substantially extending over a distance smaller than a distance between the two calibrated locations. By lowering the bandwidth of the servo control loop of the sensor object, the sensor object will be less capable of following disturbances in the grid plate. In this way, the desired speed of the sensor object may be lowered therewith making a lower calibration grid spacing possible with the same sample frequency of the sensor 2.

The method according to an embodiment of the invention is preceded by a low spatial frequency calibration step before the method can be carried out. This low spatial frequency calibration method may be a fishbone like method as described above or any other suitable calibration method. After the low spatial frequency calibration step is carried out, the spaces between adjacent calibration locations may be calibrated with the method in accordance with an embodiment of the present invention. The calibration data of the low spatial frequency calibration step and the high spatial frequency calibration step carried out by the method of the present invention may be incorporated in separate metrology maps or in a common metrology map.

To take into account any noise in the measurements, multiple measurements may be made, which measurement results are averaged. The multiple measurements may be made while the sensor object travels along the grid plate in the same or in other directions. In general it is remarked that although in FIGS. 2 and 3, the calibration movement is only shown in one direction, the method may be used for the whole grid plate wherein for each position in the x and y direction a value for the x, y and z errors in the grid plate may be determined and stored in a metrology map.

The present method may also be used to find and correct disturbances due to defects in the grid plate. For this application, it may be desired to use a dense calibration grid having for example a grid spacing of 0.1 mm or smaller.

A significant benefit of the calibration method according to an embodiment of the present invention is that the method may be carried out by the position measurement system of a lithographic apparatus. As a result, the calibration of the grid plate may be performed after the mounting of the grid plate in the lithographic apparatus. Thus, any errors in the grid plates during this mounting, such as damages during the arrangement of the grid plate in the lithographic apparatus may be taken into account during calibration.

Furthermore, the grid plate may periodically be (re-)calibrated without the need to take the grid plate out of the lithographic apparatus to calibrate it in a separate calibration device. It may be beneficial to periodically calibrate the grid plate since due to thermal or mechanical reasons errors may come into existence on the grid plate as well as particles such as dust particles may come to rest on the grid plate. By periodically re-calibrating the grid plate, such changes may be taken into account and stored in the grid plate metrology mapping. In the case of disturbances due to dust particles or any other contamination, the measurement information may also be used as input for a cleaning action.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of calibrating a grating of an encoder measurement system between two adjacent calibrated locations, the method comprising:

moving one of a sensor comprising an encoder-type sensor or a grating along the other one of the sensor or the grating at a selected speed, the speed selected such that the sensor is substantially unable to follow a disturbance in the grating substantially extending over a distance smaller than a distance between the two calibrated locations, wherein, when the disturbance is substantially unable to be followed by the sensor, a spacing between the sensor and the grating varies as the sensor passes over the disturbance, and measuring during the moving a position of the sensor with respect to the grating at a plurality of locations between the two calibrated locations.

2. The method of claim 1, wherein the moving comprises moving the sensor along the grating.

3. The method of claim 1, wherein the moving comprises moving the grating along the sensor.

4. The method of claim 1, wherein a bandwidth of a servo control loop of the one of the sensor or the grating is lowered to decrease the ability of the one of the sensor or the grating to follow the disturbances in the grating substantially extending over a distance smaller than a distance between the two calibrated locations.

5. The method of claim 1, further comprising repeating the moving and measuring and averaging results of measurements.

6. The method of claim 5, further comprising repeating the moving and measuring in same and/or other moving directions of the one of the sensor or the grating.

7. The method of claim 1, further comprising incorporating measurement results in a metrology map of the grating.

8. The method of claim 1, wherein the measuring comprises high frequency sampling the encoder-type sensor.

9. The method of claim 8, wherein a sample frequency of the encoder-type sensor is at least ten times a bandwidth of a servo controller of the one of the sensor or the grating.

10. The method of claim 9, wherein a sample frequency of the encoder-type sensor is at least fifty times a bandwidth of a servo controller of the one of the sensor or the grating.

11. The method of claim 1, wherein the method is used as a high frequency calibration of the grating.

12. The method of claim 11, wherein prior to the moving and the measuring, the method includes performing a low frequency calibration of the grating to determine at least the two calibrated locations.

13. The method of claim 12, wherein the low frequency calibration is performed using a fishbone calibration.

14. The method of claim 1, further comprising repeating the moving and the measuring to calibrate the grating between further adjacent calibrated locations.

15. The method of claim 1, wherein the sensor is a reticle stage or wafer stage of a lithographic apparatus.

16. The method of claim 1, wherein the the sensor and the grating are arranged in a lithographic apparatus.

17. The method of claim 1, wherein during the moving and measuring, measurements are made for two or more gratings arranged in two or more degrees of freedom.

18. The method of claim 17, wherein the two or more gratings are arranged on a single grid plate.

19. A method of calibrating a grating of an encoder measurement system between two adjacent calibrated locations, the method comprising:

moving one of a sensor comprising an encoder-type sensor or a grating along the other one of the sensor or the grating at a selected speed, the speed selected such that the sensor is substantially unable to follow a disturbance in the grating substantially extending over a distance smaller than a distance between the two calibrated locations, and measuring during the moving a position of the sensor with respect to the grating at a plurality of locations between the two calibrated locations, wherein the speed is selected to be at least substantially equal to a bandwidth of a servo controller of the one of the sensor and the grating multiplied by the distance between the two calibrated locations.

* * * * *